(12) United States Patent
Raschke et al.

(10) Patent No.: US 10,964,568 B2
(45) Date of Patent: Mar. 30, 2021

(54) SUBSTRATE CARRIER (71) Applicant: MEYER BURGER (GERMANY) GMBH, Hohenstein-Ernstthal (DE)

(72) Inventors: Sebastian Raschke, Thalheim (DE); Erik Ansorge, Chemnitz (DE); Mirko Kehr, Amtsberg (DE); Christian Boehm, Hohenstein-Ernstthal (DE)

(73) Assignee: Meyer Burger (Germany) GmbH, Hohenstein-Ernsthal (DE)

( * ) Notice: Subject to any disclaimer, the term of this patent is extended or adjusted under 35 U.S.C. 154(b) by 435 days.

(21) Appl. No.: 15/755,184

(22) PCT Filed: Aug. 2, 2016

(86) PCT No.: PCT/IB2016/054630
§ 371 (c)(1),
(2) Date: Feb. 26, 2018

(87) PCT Pub. No.: WO2017/033076
PCT Pub. Date: Mar. 2, 2017

(65) Prior Publication Data
US 2018/0247845 A1 Aug. 30, 2018

(30) Foreign Application Priority Data
Aug. 24, 2015 (DE) .................. 102015113956.1

(51) Int. Cl.
*H01L 21/673* (2006.01)
*H01L 21/687* (2006.01)
(Continued)

(52) U.S. Cl.
CPC .... *H01L 21/67333* (2013.01); *C23C 16/4582* (2013.01); *H01L 21/67011* (2013.01); *H01L 21/68735* (2013.01); *H01L 21/68771* (2013.01)

(58) Field of Classification Search
CPC .............. H01L 21/67333; H01L 21/67; H01L 21/68771; H01L 21/68735; C23C 16/4582
(Continued)

(56) References Cited

U.S. PATENT DOCUMENTS 4,762,606 A * 8/1988 Root .................. H01L 21/4846
206/701
5,731,230 A * 3/1998 Nevill ............... H01L 21/67333
438/15
(Continued)

FOREIGN PATENT DOCUMENTS

DE 4026244 A1 2/1992
DE 102009021563 A1 11/2010
(Continued)

*Primary Examiner* — Rafael A Ortiz
(74) *Attorney, Agent, or Firm* — Laurence A. Greenberg; Werner H. Stemer; Ralph E. Locher (57) ABSTRACT

A substrate carrier includes a substrate carrier plate having a front-sided substrate carrier surface on which at least one substrate receiving area is provided for receiving a respective substrate. The substrate carrier is intended to enable a secure support of the substrate and a simple, damage-free removal of the substrate from the substrate carrier when operating in a fast manner, preferably without impairment of the characteristics of the substrate or the substrate processing. Therefore, the substrate receiving area has an interior area and an exterior area running around the interior area. The exterior area has spaced plateaus which are raised compared to a surface of the interior area for the support of edge areas of the substrates. Ventilation channels are provided between the plateaus.

10 Claims, 4 Drawing Sheets (51) Int. Cl.
*C23C 16/458* (2006.01)
*H01L 21/67* (2006.01)

(58) Field of Classification Search
USPC .......................... 206/701, 706, 707, 710, 713
See application file for complete search history.

(56) References Cited

U.S. PATENT DOCUMENTS

| | | | |
|---|---|---|---|
| 5,758,776 A * | 6/1998 | Slocum | H01L 21/67333 206/714 |
| 6,113,702 A | 9/2000 | Halpin et al. | |
| 2002/0050246 A1 | 5/2002 | Parkhe | |
| 2007/0026148 A1 | 2/2007 | Arai et al. | |
| 2010/0089314 A1 | 4/2010 | Goodman et al. | |
| 2010/0107974 A1 | 5/2010 | Givens et al. | |
| 2014/0287142 A1 | 9/2014 | Boyd et al. | |
| 2015/0228517 A1 * | 8/2015 | Toc | H01L 21/67333 29/559 |
| 2015/0228529 A1 | 8/2015 | Afable et al. | |

FOREIGN PATENT DOCUMENTS

| | | |
|---|---|---|
| DE | 102011055061 A1 | 5/2013 |
| DE | 102014100024 A1 | 7/2015 |
| JP | H11111707 A | 4/1999 |
| JP | 2005142529 A | 6/2005 |
| TW | 200637929 A | 11/2006 |

* cited by examiner

SUBSTRATE CARRIER

BACKGROUND OF THE INVENTION

Field of the Invention

The present invention relates to a substrate carrier with a substrate carrier plate comprising a front-sided substrate carrier surface on which at least one substrate receiving area is provided for receiving a substrate, respectively.

Substrate carriers, which are used particularly for processing semi-conductor substrates such as silicon wafers, shall hold at least one substrate safely thereby enabling its respectively their flawless processing. Hereby, horizontally aligned substrate carrier, so-called trays or carriers are typically used on whose surface at least one laminar substrate such as a semi-conductor wafer is placed and is processed in this position and/or is transported on the substrate carrier. The substrate(s) shall thereby be supported stably on the substrate carrier. After the effected processing respectively after the effected transport, the substrate(s) can be taken from the substrate carrier without damage.

A substrate carrier of the initially mentioned type is known from the document DE 40 26 244 C2, for instance. The known substrate carrier comprises a substrate carrier plate with a deepening in which a substrate is supported in a laminar fashion. The side walls of the depeening hold the substrate in its position. For a vacuum fixation of the substrate on the substrate carrier as well as a possible ventilation after a vacuum process, a circumferential space between the substrate and the substrate carrier as well as a bore below the substrate going through the substrate carrier are provided according to this state of the art. That is, the substrate is centrally arranged on a kind of pedestal on the substrate carrier, while the outer areas of the substrate do not touch the substrate carrier since the substrate carrier is recessed at these areas. Moreover, another space can be centrally arranged below the substrate, wherein the substrate carrier plate comprises a through opening in this central area. It is unfavorable in this state of the art that the pedestal can be replicated particularly in a plasma process on the substrate, whereby the characteristics of the substrate, for example the electric conductivity, can be negatively influenced. Furthermore, the substrate can tilt into the circumferential deepening and thus is no longer supported in a laminar fashion on the substrate carrier. Thereby, for instance, damages of the substrate can be produced and/or inhomogeneities can occur during the substrate processing such as an inhomogeneous substrate coating.

SUMMARY OF THE INVENTION

Therefore, it is the object of the present invention to propose a substrate carrier, which enables, possibly without impairment of the characteristics of the substrate or the substrate processing, a secure support of the substrate and a simple, damage-free removal of the substrate from the substrate carrier when operating in a fast manner.

According to the invention, the object is solved in that the substrate receiving area comprises an interior area and an exterior area running around the interior area, wherein the exterior area comprises spaced plateaus which are raised compared to a surface of the interior area for supporting periphal areas of the substrates, wherein ventilation channels are provided between the plateaus.

In the substrate carrier according to the invention, in the front-sided substrate carrier surface, several supporting parts separated by gaps are provided, which are at least partly arranged below a substrate provided on the substrate carrier forming a supporting area for an periphal area of a substrate to be placed on the substrate carrier. Thus, the substrate lies edge-sided on a raised level compared to the interior area of the substrate receiving area on the substrate carrier plate. Between the spaced plateaus as well as in the interior area of the substrate receiving area, the front-sided substrate carrier surface comprises a lower level than on the plateaus. Thereby, channels are provided between the plateaus, which operate as ventilation channels during ventilation and/or de-airing, that is leading gas into the interior area of the substrate receiving area and thus enabling a rear ventilation of the substrate, which on the other hand permits a simple, damage-free removal of the substrate from the substrate carrier.

Hence, the substrate carrier according to the invention has the advantage that the substrate with its periphal areas is placeable speedily in a plane-parallel fashion on the substrate receiving area and in doing so, no gas cushion can develop between the substrate and the supporting parts, by which a horizontal shifting of the substrate on the substrate carrier can be largely avoided. Thereby, at least one free space between the substrate carrier and the substrate is provided in the interior area of the substrate receiving area. The gas being in that free space can escape to the outside through the ventilation channels provided between the plateaus in the substrate support so that the substrate does not "float" on the exterior area. This facilitates the secure and speedy placing of the substrate on the substrate carrier plate as a shifting of the substrate on a gas cushion is avoided.

The ventilation channels further effectuate that, when taking the substrate from the substrate carrier, the gas is led sideways below the substrate and thereby the substrate can be lifted easily and damage-free from the substrate carrier plate. Furthermore, the plateaus and ventilation channels are only provided in an edge area of the substrate so that a reproduction of these structures on the substrate is minimized.

In a preferred embodiment of the substrate carrier according to the invention, the plateaus are provided on a same level as the front-sided substrate carrier surface, except for a surface of the interior area(s). That is, a different, namely a lower level than for the rest of the front-sided substrate carrier surface, is provided only for the interior area and the ventilation channels. The plateaus can be formed by being areas of the front-sided substrate carrier surface between the ventilation channels. The result of this is a cost-effective production of the substrate carrier according to the invention.

In an advantageous development of the substrate carrier according to the invention, the ventilation channels are provided all-sided around the substrate receiving area. Thereby, a uniform de-airing and ventilation of a back side of the substrate is made possible. Hence, the air or gas cushion below the substrate is evenly removed in the substrate carrier support respectively evenly reproduced in the substrate removal so that the substrate is not only lying securely and in a laminar fashion on the substrate carrier but can also be removed securely and speedily from it.

The plateaus are particularly preferably provided bar-shaped in the present invention. By doing so, on the one hand, a stable support method is provided while, on the other hand, the bar-shaped plateaus only form a small support area and thus only reproduce minimally or not at all on a back side of the substrate and/or on a substrate carrier front side in the substrate processing. The support forming plateaus parts are thus preferably longish and/or rectangular, whereby a simple and cost-effective production of the plateaus and/or the ventilation channels is possible. According to a preferred embodiment of the substrate carrier, the ventilation channels are milled into the front-sided substrate carrier surface. That is why the ventilation channels are producible in a simple and cost-effective way. The interior area, which has a lower height level than the exterior area, can equally be milled into the front-sided substrate carrier surface.

In an alternative embodiment of the present invention, in the interior area, at least one support structure is provided, on which the substrate can at least partly be supported.

Thereby, the contact area between the substrate and the substrate carrier is effectively increased, whereby the heat transfer between the substrate carrier and the substrate is improved. The structure of the support structure, however, can be reproduced on the substrate, particularly on a substrate front side, as well as it can result in unwanted influences of the plasma during a plasma process.

In a suitable embodiment of the substrate carrier according to the invention, the plateaus and/or the support structure are applied by a material coating onto the front-sided substrate carrier surface. Variants for coating such plateau-like support parts as well as the support structure are, for instance, 3D print, (photo)lithographic methods, screwing on, soldering, spot-tacking or welding. Moreover, the embodiments of the present invention, at which ventilation channels are milled into the front-sided substrate carrier surface and the plateaus are applied onto the front-sided substrate carrier surface by material coating, can also be combined.

In a particularly advantageous development of the substrate carrier according to the invention, a height of the plateaus and/or a depth of the ventilation channels is in a range of 0.1 mm to 1 mm, preferably in a range from 0.2 mm to 0.5 mm. Hereby, the height of the plateaus is meant to be the height compared to the interior area of the substrate support area and/or the height compared to a deepest spot of a ventilation channel. It has proven that the ventilation and de-airing in a depth range and/or height range of 01. mm to 1 mm, preferably of 0.2 mm to 0.5 mm is satisfactory for a fast handling of the at least one substrate. On the other hand, a good thermal connection shall be provided between the substrate and the substrate carrier which is also ensured by the depth range and/or height range of 0.1 mm to 1 mm, preferably of 0.2 mm to 0.5 mm.

It has proven particularly advantageous in a substrate carrier according to the invention if the distance of the plateaus to each other and/or a width of the ventilation channels is in a range of 0.1 mm to 5 mm, preferably in a range of 0.2 mm to 1 mm. Hereby, the distance of the plateaus to each other is meant to be the distance, which a plateau in the exterior area of the substrate support area has to an adjacent plateau, to say the distance which is induced by the width of a ventilation channel between two plateaus. In this distance range and/or width range of 0.1 mm to 5 mm, preferably of 0.2 mm to 1 mm, a satisfactory gas flux during the de-airing and/or ventilation process is the result.

In a preferred embodiment of the substrate carrier according to the invention, the substrate carrier plate is formed of at least one electrically conductive material and/or is coated with at least one electrically conductive material. Thereby, the substrate carrier plate can be provided, for instance, as an electrode in a substrate treatment chamber. This is particularly convenient, if the at least one substrate to be processed has to be adjusted to a certain electrical potential. Electrically conductive material could be, for instance, a metal or an alloy, particularly aluminum, titan or also an alloy of one of these metals. Furthermore, electrically conductive materials also have a good thermal conductivity which is a desired characteristic for the substrate carrier plate in order to warm or cool the substrate being arranged on the front-sided substrate carrier surface of the substrate carrier plate by a tempering device being on a back side of the substrate carrier plate.

According to an advantageous development of the substrate carrier according to the invention, the exterior area of the substrate receiving area is at most a tenth of a surface of a substrate provided on the substrate carrier. Thereby, a possible influence of the substrate by a geometrical reproduction of the exterior area onto the substrate in a treatment process is minimized.

It is particularly preferred when at least one raised projection for a lateral limitation of a substrate support area on the substrate receiving area is provided off the front-sided substrate carrier surface. The projection is used as a lateral support for the substrate. Thus, the substrate cannot shift horizontally, for instance in a ventilated state, and is fixed in its position on the substrate receiving area. Advantageously, several projections are provided around a substrate receiving area so that a shifting of a substrate in all directions is prevented. Moreover, exactly one projection can be provided between adjacent substrates, respectively so that adjacent substrates "share" one projection, respectively. Alternatively, spaced projections can also be provided between adjacent substrates so that each projection only neighbors one substrate, respectively.

In an alternative embodiment of the present invention, the projection can be provided as at least one step running around the substrate receiving area in the front-sided substrate carrier surface. This step has a higher level than the plateaus of the exterior area, whereby a so-called substrate nest is formed. Ventilation channels run through the step which can be, for instance, connected to the ventilation channels of the exterior area. Hence, the substrate is not fully circumferentially tightly enclosed by the step and effective ventilation and de-airing of the substrate receiving area can be guaranteed.

In an advantageous development of the substrate carrier according to the invention, the at least one projection is a stud. Hereby, stud is meant to be a cylindrical object whose lateral surface extends vertically to the front-sided substrate carrier surface. A common term for such a stud is "pin". Such cylindrical objects are particularly cost-effectively producible. In alternative embodiments, the stud can also be provided as a versatile prism, for instance, as three-sided prism, cuboid or an eight-sided prism, wherein a lateral surface of the prism extends vertically along a long extension of the prism to the front-sided substrate carrier surface, respectively.

Preferably, the projection is placed in a blind hole provided in the front-sided substrate carrier surface. A blind hole is a recess in the substrate carrier surface, which does not go through the substrate carrier plate. The projection is inserted into the blind hole and thus sinks partly in the bore and only a part of the projection projects from the bore in order to prevent the substrate from a lateral shifting. Hence, the projection is inserted loosely in the blind hole. Alternatively, the projection can also be hold form-fitting in the blind hole, for instance, by a bayonet-seal or by surfaces of the blind hole and the projection extending wedge-like against each other. Thereby, the projection can be connected in a firm but releasable way to the substrate carrier plate. In a special case, the projection can be provided as screw and the blind hole can be provided with a winding so that the projection can be screwed in the front-sided substrate carrier surface.

In a special embodiment of the present invention, the projection is inserted from a back side of the substrate carrier, wherein the projection projects from an opening of the front-sided substrate carrier surface, wherein the projection is held in the opening by the size of the opening and wherein the projection is fixed in the opening by a fixation element from the back side. Thus, in this variant, an opening going through the substrate carrier plate is provided, through which the projection can extend from the back side of the substrate carrier. The opening and the projection can thereby be formed in such a way that in the direction of the front-sided substrate carrier surface a kind of a stop is provided, thus the projection can only go through the opening up to a certain point. At the back side of the substrate carrier and thus at the back side of the opening, the projection is fixed at the substrate carrier by the fixation element. The fixing can particularly be provided gas-tight so that the fixation of the projection closes the opening in the substrate carrier.

According to another alternative of the present invention, the projection is arranged in a groove being provided in the substrate carrier plate running parallel to the front-sided substrate carrier surface, wherein a supporting element of the projection being provided in the groove is encompassed by a counter supporting element. Hence, the groove can be provided wider in a deep area than in an area close to the front-sided substrate carrier surface so that a tapering of the groove in the direction of the front-sided substrate carrier surface is provided. The tapered area can form the counter supporting element. The projection on her part can also be expanded in a bottom part provided in the groove, similar to a screw head. This expanded area of the projection can form the fixation element. Thereby, the projection is held in the groove by form closure. In case of a long groove, the projection, like a so-called slot nut, can be shifted in a desired position and can be secured one-sidedly or bilaterally against shifting by at least one stop element.

In a preferred embodiment of the substrate carrier according to the invention, the projection is provided from at least one electrical insulator. Electrical insulators are poor heat conductors, whereby the formation of a heat sink is prevented by the stud as projection. Moreover, the substrate carrier plate can be used as electrode in a substrate treatment process. By the formation of the projection as electrical insulator, it is prevented that potential tops build up above the substrate carrier plate. If the substrate, for instance, is processed in a plasma, a distortion of plasma is thus avoided by the projection being provided as an electrical insulator. Materials such as glass, quartz, ceramic, or plastics, particularly aluminum oxide are possible for the projection. Therefore, such projections can also be called "ceramic pins".

According to an advantageous development of the substrate carrier according to the invention, the projection is hollow on the inside. The projection can, for instance, be a hollow cylinder. This is favorable for a substrate treatment process in a vacuum since the projection cannot be pulled from the blind hole by the resulting under pressure during de-airing.

It has also proven advantageous if the projection is tapering pointed or rounded at one end facing away from the substrate carrier plate. Should a substrate erroneously be placed on the front-sided substrate carrier surface outside of the substrate receiving area so that the substrate touches an inclined surface of the projection, than this inclined surface of the projection leads to a guidance of the substrate towards the substrate receiving area. Thereby, it is effected that the substrates are arranged between the projections.

BRIEF DESCRIPTION OF THE SEVERAL VIEWS OF THE DRAWING

Advantageous embodiments of the present invention, their structure, function and advantages are explained in more detail by figures in the following, wherein FIG. 1 schematically shows a top view on a front-sided substrate carrier surface of a substrate carrier according to the invention.

DESCRIPTION OF THE INVENTION

Figure 1:
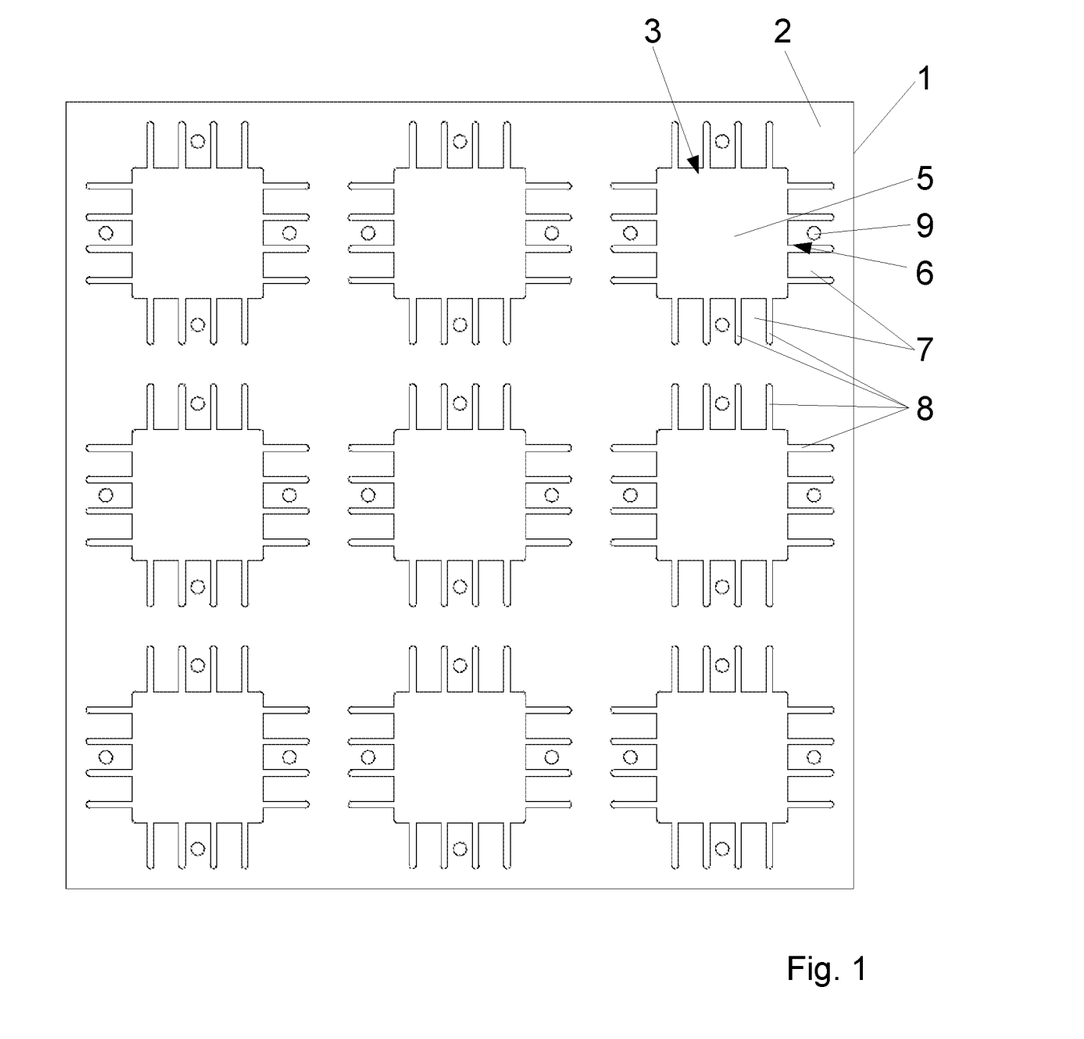

FIG. 1 shows an embodiment of a substrate carrier in a top-view. The substrate carrier comprises a substrate carrier plate 1 with a front-sided substrate carrier surface 2. Rectangular substrate receiving areas 3 are spaced in several columns and rows on the substrate carrier surface 2. Each substrate receiving area 3 comprises a rectangular interior area 5, respectively with a low height level as well as an exterior area 6 running around the interior area 5. Alternatively, it is also conceivable that the substrate receiving area 3 and the interior area 5 have other geometries than being rectangular, for instance, circular, oval or octagonal.

In the exterior area 6, plateaus 7 having a higher level compared to the interior area 5 as well as ventilation channels 8 with the low height level of the interior area 5 are provided. In the embodiment of FIG. 1, the ventilation channels 8 are provided as creasings being parallel or vertically aligned to each other and the plateaus 7 are provided as bars being parallel or vertically aligned to each other. In other embodiments of the present invention, the ventilation channels 8 can also be arranged in an acute or in an obtuse angle to each other. Likewise, the plateaus 7 can also from acute or obtuse angles to each other.

Projections 9 projecting from the substrate carrier surface 2 are provided around the substrate receiving area 3. In the embodiment of FIG. 1, exactly one projection 9 is provided for each side of the substrate receiving area 3 so that the rectangular substrate receiving area 3 is surrounded by four projections 9. Thereby, a shifting of a substrate 4 in each direction can be prevented. In alternative embodiments, several projections 9 can be arranged for each side of the substrate receiving area 3. When having circular or oval geometries of the substrate receiving area 3, it is of advantage to arrange the projections 9 also circular or oval around the substrate receiving area 3. The projections 9 of the embodiment of FIG. 1 are arranged on plateaus 7. Alternatively, the projections 9 can be arranged in ventilation channels 8, wherein the ventilation channels 8 are wider then than the projections 9 so that the gas flux through the ventilation channels 8 is unhindered.

Figure 2:
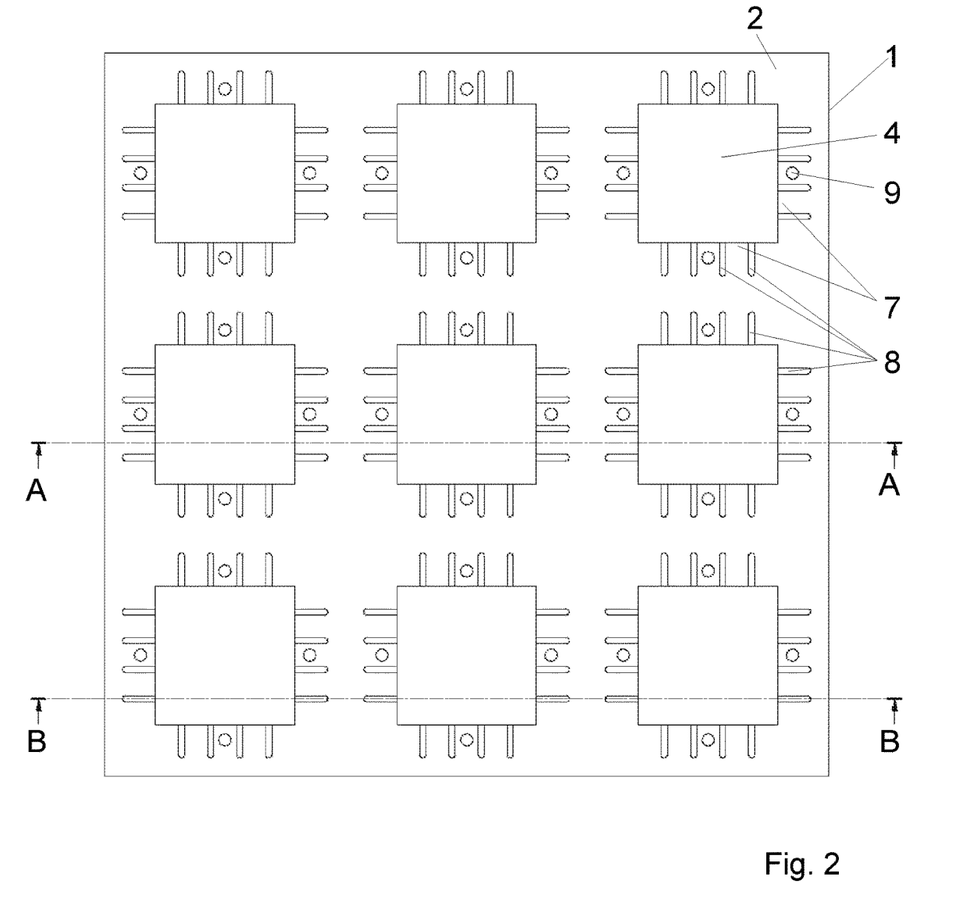
FIG. 2 schematically shows a top view on the front-sided substrate carrier surface of the substrate carrier of FIG. 1 with substrates placed on substrate receiving areas.

FIG. 2 shows the substrate carrier of FIG. 1 in a top-view onto the front-sided substrate carrier surface 2 with substrates 4 lying on the substrate carrier plate 1. Here, the substrates 4 are lying on the substrate receiving areas 3 and cover them. In the embodiment shown here, the substrates 4 are rectangular, but can also be, for instance, round or other, for instance, multiangular geometries.

The projections 9 are laterally spaced to the substrates 4. A low distance is provided between the substrates 4 and the projections 9 so that one substrate 4 each can be arranged between four projections 9 surrounding the substrate 4. On the other hand, this distance between the substrate 4 and the projections 9 is chosen so low that the substrate 4 is limited by one of the projections 9 if slightly shifted horizontally.

Furthermore, the ventilation channels 8 are arranged laterally and in an edge area of the substrate 4, running from an exterior area 6 to an interior area 5, respectively and thus are partly arranged under the respective substrate 4. Between two ventilation channels 8, a plateau 7 is provided, respectively, wherein the substrate 4 is lying on the plateau 7, wherein the plateaus 7 in FIG. 2 are only recognizable as areas between the ventilation channels 8.

Figure 3:
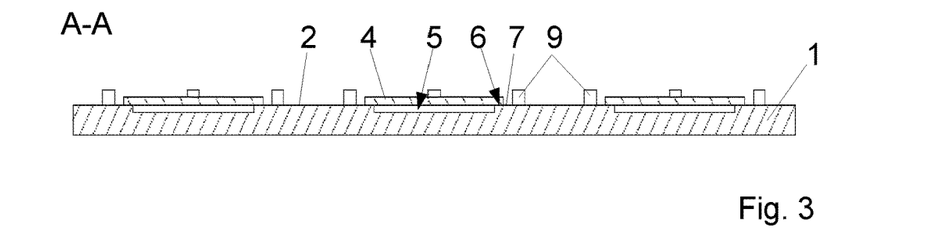
FIG. 3 schematically shows a cross-sectional view of a substrate carrier according to the invention with substrates placed thereon along plateaus of substrate receiving areas.

FIG. 3 shows a cross-section of a substrate carrier according to the invention with substrate 4 supported thereon according to the line A-A of FIG. 2 that is along the plateaus 7. On the front-sided substrate carrier surface 2 of the substrate carrier plate 1, the substrates 4 are arranged. Several projections 9 are each laterally spaced to the substrates 4 with a low distance to the respective substrate 4. The substrate 4 is supported in an exterior area 6 on at least one plateau 7, respectively, whereas in the interior area 5 below the substrate 4, a free space or hollow space between the substrate 4 and the substrate carrier plate 1 is provided.

Figure 4:
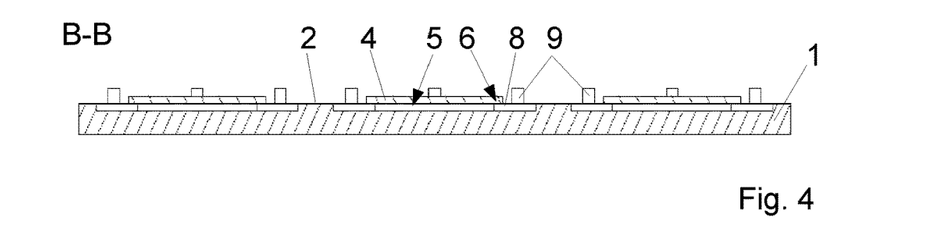
FIG. 4 schematically shows another cross-sectional view of the substrate carrier according to the invention of FIG. 3 with substrates placed thereon along ventilation channels.

FIG. 4 shows a cross-section of a substrate carrier according to the invention with substrates 4 supported thereon according to the line B-B of FIG. 2 that is along the ventilation channels 8. In contrast to FIG. 3, the ventilation channel 8 extending under the substrate 4 in the exterior area 6 is hereby visible. The ventilation channel 8 is on the same height level as the interior area 5 and is connecting same fluidicly with a space provided above and below the substrate carrier plate 1. If a substrate carrier plate 1 with substrates 4 placed thereon is deaerated for a vacuum process, the in the interior area 5 arranged gas being in the hollow space between the substrate carrier plate 1 and the substrate 4 can be led through the ventilation channels 8 to the outside. In case the ventilation is done after a vacuum process, the gas in turn can stream through the ventilation channels 8 into the interior area 5 and thus can ventilate the substrate 4 from the back.

Figure 5:
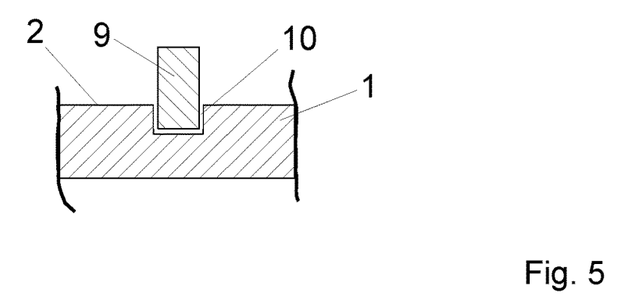
FIG. 5 shows a cross-sectional view of a detailed view of a substrate carrier according to the invention with a cylindrical or cuboid projection in a blind hole.

FIG. 5 schematically shows a cross-section of a detailed view of a projection 9 formed as a stud of a substrate carrier according to the invention in a blind hole 10. The blind hole 10 is inserted in the front-sided substrate carrier surface 2 of the substrate carrier plate 1, wherein the blind hole 10 depicts a depeening in the front-sided substrate carrier surface 2, which does not go through the substrate carrier plate 1. Hence, the blind hole 10 can be a round recess, also in form of a cylinder; alternatively, however, it can also have an angled or oval base area.

The projection 9 is in its base area preferably congruent to the base area of the blind hole 10, but made smaller so that a smooth insertion of the projection 9 into the blind hole 10 is possible. In case of a round blind hole 10, the bar-shaped projection 9 is thus provided as cylinder. In the embodiment of FIG. 5, the projection 9 is formed of one block and as a straight body.

Figure 6:
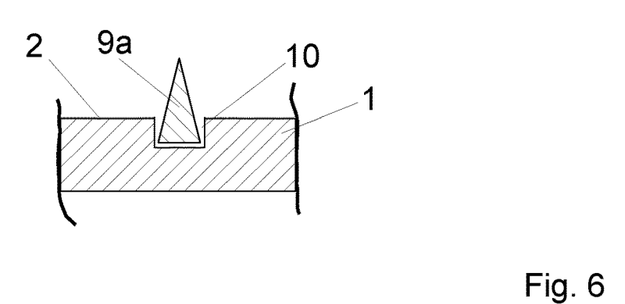
FIG. 6 shows a cross-sectional view of a detailed view of a substrate carrier according to the invention with a pyramidal or conical projection in a blind hole.

FIG. 6 schematically shows a cross-section of a detailed view of a projection 9a in an embodiment of the substrate carrier according to the invention usable instead of the projection 9. The projection 9a is formed as an upwardly tapered body that is in case of a round base area as cone and in case of an angled base area as pyramid. Alternatively, it is also conceivable that a socket of the projection 9a formed as straight body, is sunk into the blind hole 10 and only an area of the projection 9a is being raised above the blind hole is formed as upwardly tapered body. In the embodiment of FIG. 6, the projection 9a is formed of one block.

Figure 7:
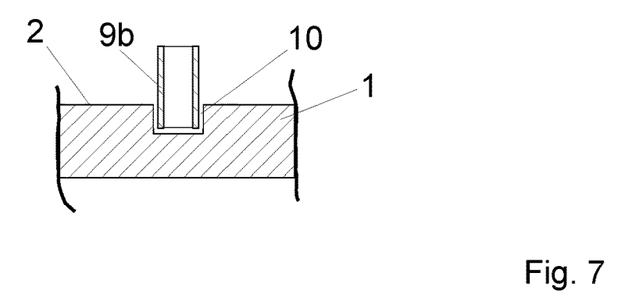
FIG. 7 shows a cross-sectional view of a detailed view of a substrate carrier according to the invention with a projection being hollow on the inside in a blind hole.

FIG. 7 schematically shows a cross-section of a detailed view of another alternative embodiment of a projection 9b usable instead of the projection 9 or 9a in the substrate carrier. The projection 9b is hollow in the inside, thus can be a cylinder tube or a prism being hollow in the inside. This has, particularly in a vacuum process, the advantage that when de-airing, the projection 9b is not drawn out of the blind hole 10 due to the under pressure arising over the front-sided substrate carrier surface 2.

Figure 8:
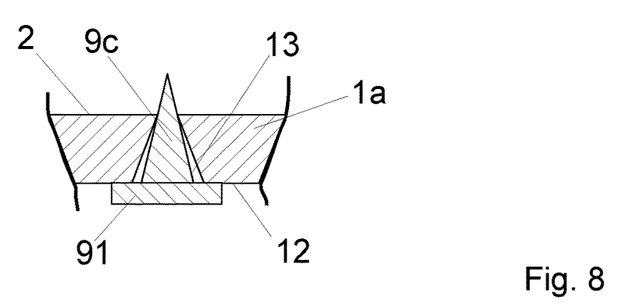
FIG. 8 shows a cross-sectional view of a detailed view of an alternative embodiment of a substrate carrier according to the invention with a projection going through an opening of the substrate carrier.

FIG. 8 schematically shows a cross-section of an alternative embodiment of a substrate carrier according to the invention, in which the substrate carrier plate 1a comprises a through opening 13. A projection 9c extends from one back side 12 of the substrate carrier to the front-sided substrate carrier surface 2 going through the opening 13. The opening 13 as well as the projection 9c are tapered in the direction of the front-sided substrate carrier surface 2, wherein the opening 13 and the projection 9c have the same circumference at the front-sided substrate carrier surface 2 in the shown embodiment, thus a stopper is provided there, whereby the projection 9c cannot project further through the opening 13. At the back side 12 of the substrate carrier, a fixation element 91 is arranged at the projection 9c, which can be connected firmly and gas-tight with the back side 12, for instance, by soldering. Thereby, a falling out of the projection 9c from the substrate carrier plate 1a can be prevented.

Figure 9:
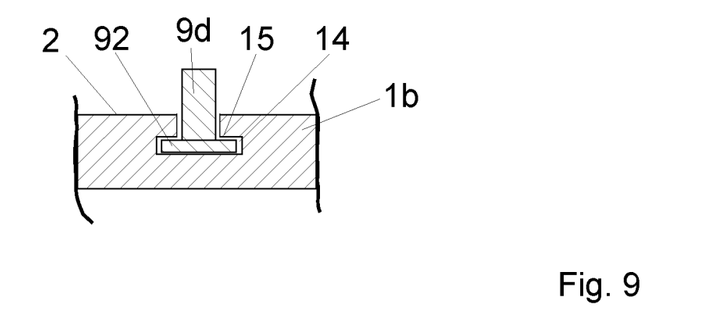
FIG. 9 shows a cross-sectional view of a detailed view of another alternative embodiment of a substrate carrier according to the invention with a projection held in a groove.

FIG. 9 schematically shows a cross-section of another embodiment of a substrate carrier according to the invention with the substrate carrier plate 1b. The substrate carrier plate 1b comprises a groove 14 provided in the front-sided substrate carrier surface 2, which is widened compared to an area close to the substrate carrier surface 2. The projection 9d provided in the groove 14 is forms adapted to the groove 14, thus has a widening in a lower part, which forms the support element 92. The support element 92 is encompassed by the counter support element 15, which is provided by the groove 14 in the substrate carrier plate 1b. Thereby, a vertical pulling out of the projection 9d from the groove 14 is prevented by form closure. The projection 9d can be secured against a horizontal shifting in the groove 14 by at least one stop element, which can be fixed besides the projection 9d in the groove 14, respectively.

Figure 10:
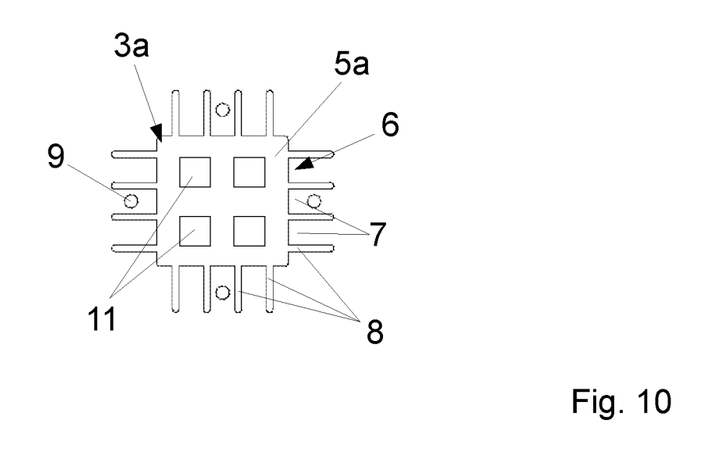
FIG. 10 schematically shows a top-view on a substrate receiving area of a substrate carrier according to the invention with support structures arranged in the interior area.

FIG. 10 shows an alternative embodiment of a receiving area 3a in a top-view. In contrast to the embodiment according to FIG. 1, four each rectangular-shaped support structures 11 are provided in the interior area 5a, which can have the same level as the plateaus 7. Thus, the support structures 11 may come into contact with a substrate 4 which can be placed on the substrate receiving area 3a. Thereby, a sagging of the substrate 4 over the interior area 3a can be avoided, on the one hand. Moreover, a contact area between the substrate 4 and the substrate carrier plate 1 is thus enlarged in comparison to the embodiment according to FIG. 1, whereby the heat transfer between the substrate carrier plate 1 and the substrate 4 is increased.

The invention claimed is:

1. A substrate carrier, comprising:
   a substrate carrier plate including a front-sided substrate carrier surface having at least one substrate receiving area for receiving a respective substrate;
   said substrate receiving area including an interior area and an exterior area extending around said interior area, said interior area having a surface, said exterior area having mutually spaced-apart plateaus for supporting edge areas of the substrate, said plateaus being raised as compared to said surface of said interior area, said plateaus being formed as bars aligned in parallel or perpendicular to one another;
   ventilation channels disposed between said plateaus, said ventilation channels each extending from said exterior area into said interior area, said ventilation channels being formed as grooves aligned parallel or perpendicular to one another, said ventilation channels and said interior area being at an identical height level, and said ventilation channels connecting said interior area fluidicly with a space above and around said substrate carrier plate;
   said plateaus and said front-sided substrate carrier surface being disposed at an identical level, except for said surface of the interior area; and
   said front-sided substrate carrier surface, except for said interior area and said ventilation channels, being disposed at a single height level.

2. The substrate carrier according to claim 1, wherein said ventilation channels are provided circumferentially around said substrate receiving area.

3. The substrate carrier according to claim 1, wherein said ventilation channels are milled into said front-sided substrate carrier surface.

4. The substrate carrier according to claim 1, wherein said plateaus are material coatings on said front-sided substrate carrier surface.

5. The substrate carrier according to claim 1, which further comprises at least one of a height of said plateaus or a depth of said ventilation channels being in a range of 0.1 mm to 1 mm.

6. The substrate carrier according to claim 1, which further comprises at least one of a distance between said plateaus or a width of said ventilation channels being in a range of 0.1 mm to 5 mm.

7. The substrate carrier according to claim 1, wherein said substrate carrier plate is at least one of formed of or coated with at least one electrically conductive material.

8. The substrate carrier according to claim 1, which further comprises at least one projection projecting from said front-sided substrate carrier surface for a lateral limitation of a substrate support area on said substrate receiving area.

9. The substrate carrier according to claim 8, wherein said at least one projection is a stud.

10. The substrate carrier according to claim 8, wherein said at least one projection is formed of at least one electrical insulator.

* * * * *